United States Patent [19]
Paurus et al.

[11] Patent Number: 5,162,977
[45] Date of Patent: Nov. 10, 1992

[54] PRINTED CIRCUIT BOARD HAVING AN INTEGRATED DECOUPLING CAPACITIVE ELEMENT

[75] Inventors: Floyd G. Paurus; Archibald W. Smith, both of Boulder; Stanley R. Szerlip, Longmont, all of Colo.

[73] Assignee: Storage Technology Corporation, Louisville, Colo.

[21] Appl. No.: 750,409

[22] Filed: Aug. 27, 1991

[51] Int. Cl.⁵ .............. H05K 1/03; H05K 1/18; B32B 9/00
[52] U.S. Cl. .................. 361/401; 428/209; 174/68.5
[58] Field of Search .......... 361/401, 412, 414; 174/68.5; 252/520; 428/209; 29/830

[56] References Cited

U.S. PATENT DOCUMENTS

| | | | |
|---|---|---|---|
| 3,673,092 | 6/1972 | Dietz | 252/520 |
| 4,490,429 | 12/1984 | Tosaki et al. | 174/68.5 X |
| 4,558,020 | 12/1985 | Itakura et al. | 361/322 X |
| 4,775,573 | 10/1988 | Turek | 428/209 |
| 4,882,455 | 11/1989 | Sato et al. | 174/68.5 |
| 4,908,258 | 3/1990 | Hernandez | 428/209 X |
| 4,987,108 | 1/1991 | Takagi et al. | 501/138 |
| 5,010,641 | 4/1991 | Sisler | 29/830 |

OTHER PUBLICATIONS

"Properties of Very Thin Sol-Gel Ferroelectrics", Sanchez et al., Proceedings of the Second Symposium on Integrated Ferroelectrics, *Ferroelectrics*, vol. 116, pp. 1-17, Gordon and Breach Science Publishers, 1991.
"Eliminating Capacitors From Multilayer PCBs", Sisler, *Printed Circuit Design*, Jul. 1991.

*Primary Examiner*—Donald A. Griffin
*Attorney, Agent, or Firm*—Dorr, Carson, Sloan & Peterson

[57] ABSTRACT

A printed circuit board is disclosed which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferro-electric ceramic substance having a high dielectric constant. The ferro-electric ceramic substance is typically a nanopowder combined with an epoxy bonding material. The resulting capacitance of the power distribution core is typically sufficient to totally eliminate the need for decoupling capacitors on a typical printed circuit board.

18 Claims, 3 Drawing Sheets

PRINTED CIRCUIT BOARD HAVING AN INTEGRATED DECOUPLING CAPACITIVE ELEMENT

FIELD OF THE INVENTION

This invention relates generally to printed electronic circuit boards, and more specifically to a printed circuit board having an embedded high capacitance core used as a decoupling capacitor for integrated circuits installed on the printed circuit board.

PROBLEM

As presently constructed, typical printed circuit boards consist of multiple layers of composites of organic and inorganic materials, with internal and external wiring, allowing electrical components to be mechanically supported and electrically connected. The technology trend in printed circuit board manufacturing has been towards increasing numbers of interconnect layers, greater pass-through hole densities (permitted by smaller hole diameters), and finer line (trace) widths. The goal of this trend is to allow greater numbers of components to be installed on a printed circuit board of a given size. Throughout this evolution in printed circuit board technology, however, little progress has been made with respect to building active or passive electronic devices as integrated elements during the multilayer printed circuit board manufacturing process. This lack of progress is due to numerous problems associated with such integration. Printed circuit board manufacturing processes and circuit manufacturing processes are so basically incompatible in their required cleanliness, thermal cycle, photolithography and other requirements, that few process similarities exist.

The state of the electronic art is such that, for a typical printed circuit board assembly having a large number of integrated circuits, a correspondingly large number of decoupling capacitors is typically required. These decoupling capacitors are required to provide for instantaneous current requirements of the integrated circuits, and to reduce system noise. Such capacitors occupy considerable printed circuit board surface space, require extra assembly (insertion) time, and increase the overall cost of a completed printed circuit board unit. In addition to the percapacitor cost, each capacitor also constitutes a potential point of failure that reduces inherent system reliability.

Although present printed circuit boards often contain a "dielectric core" located between a power plane and a ground plane, the material used in the dielectric core is typically ordinary glass fiber prepreg (e.g., fiberglass cloth and a fire retardant epoxy resin). Cores using fiberglass as the dielectric material typically exhibit capacitances of 10 picofarads per square inch, which may marginally reduce system noise. However, this capacitance-toarea ratio is not sufficient to satisfy the inrush current requirements of most integrated circuits, and as a result, further decoupling (in the form of externally mounted capacitors) is required.

SOLUTION

The above problems are solved, and a technical advance achieved in the field by the high-capacitance-core printed circuit board of the present invention. Because the present invention integrates a high capacitance core into a printed circuit board, the core is easily interconnected with components mounted on either side of the printed circuit board using standard printed circuit board assembly technology. Essentially, the printed circuit board of the present invention comprises a standard multi-layer printed circuit board having a high capacitance core sandwiched between two of the layers. The high capacitance core consists of a signal ground plane and a printed circuit board power plane separated by a dielectric core element having a high dielectric constant. The high dielectric constant material is typically a resin/epoxy material with an added high dielectric constant filler. The core element is constructed from, for example, glass cloth impregnated with a bonding material, such as epoxy resin loaded with a ferro-electric ceramic substance having a high dielectric constant. The ferro-electric ceramic substance (used for loading the epoxy resin) is first ground to a nanopowder (i.e., wherein the average particle radius is less than 0.5 microns). The nanopowder is then combined with an epoxy resin to form the bonding material with which the glass cloth or other insulating structural medium is impregnated. Grinding the ceramic substance into a fine powder increases the internal surface area of the substance without increasing the volume fraction, and thus provides for a higher dielectric constant and a corresponding higher capacitance to surface area ratio.

A printed circuit board core using a glass fiber/nanopowder loaded (filled) epoxy construction may typically exhibit a capacitance of 0.1 microfarads per square inch, which is an improvement of up to 4 orders of magnitude over the prior art. A printed circuit board core with such capacitance characteristics typically requires no additional decoupling for the associated printed circuit board components, and thus obviates the need for decoupling capacitors which are mounted externally on the printed circuit board.

In view of the fact that practically every integrated circuit on a given printed circuit board requires a decoupling capacitor, a very large number of decoupling capacitors are required for printed circuit board assemblies each year. The annual expenditure associated with capacitor purchase, inventory, assembly, testing, etc., amounts to hundreds of millions of dollars per year. Considering component savings alone, a printed circuit board which obviates the need for decoupling capacitors is obviously of great value.

DETAILED DESCRIPTION OF THE INVENTION

Figure 1:
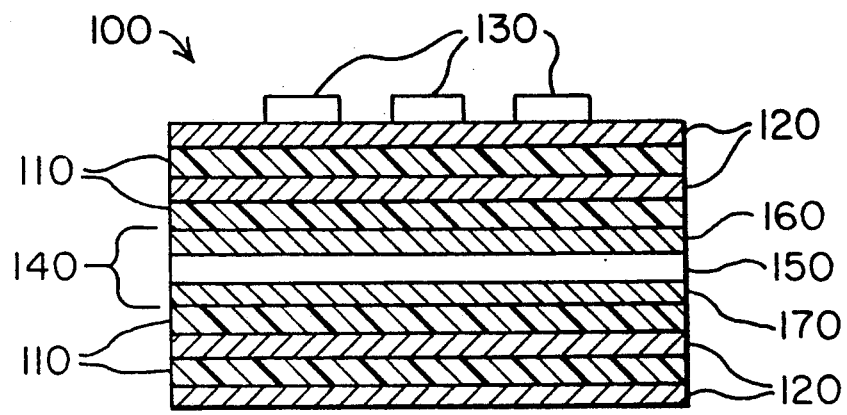
FIG. 1 shows a high capacitance core printed circuit board in accordance With the present invention.

In a typical prior art multi-layered printed circuit (PC) board, a plurality of layers of planar, copper foil-clad fiberglass elements are laminated together, with certain of the copper surfaces having been previously etched to provide the desired signal paths between externally mounted components. Power is typically supplied to the externally mounted components, such as integrated circuits, via a power distribution core consisting of a fiberglass/epoxy dielectric element sandwiched between a copper foil power plane and a similar ground plane. The dielectric constant of the fiberglass/epoxy dielectric typically ranges from approximately 4.0 to 5.5. Such a low dielectric constant provides a capacitance of approximately 10 picofarads per square inch, which is not sufficient to satisfy the inrush (instantaneous) current requirements of a typical integrated circuit. Therefore, a fiberglass/epoxy power core element necessitates that additional, externally mounted decoupling capacitors be used on the printed circuit board.

High Capacitance PC Board Core Construction

FIG. shows a novel high capacitance core multiple layer fiberglass-epoxy element printed circuit board 100 in accordance with the present invention. The present invention substitutes, for the fiberglass/epoxy dielectric power distribution core of the prior art, a capacitive core element 150 having a dielectric constant of up to four or more orders of magnitude greater than that of a typical fiberglass/epoxy composition. The high capacitance core printed circuit board 100 is comprised of a plurality of layers of prior art-type foil-clad 120 fiberglass plates or panels 110, with a novel high capacitance core 140 being situated between two of the fiberglass plates or panels 110. The high capacitance power distribution core 140 is composed of, for example, a copper foil ground plane 170, a copper foil power distribution plane 160, and a center element 150 of high dielectric constant material sandwiched between the two planes 160,170. As in the prior art, power is supplied to the externally mounted components 130, such as integrated circuits, via the power distribution core 140. However, the present invention eliminates the need for decoupling capacitors externally mounted on the printed circuit board 100, thus significantly simplifying the manufacturing of the finished circuit board 100.

High Capacitance Core Materials

In one embodiment of the present invention, the high capacitance core element 150 is composed of glass fiber impregnated with a ceramic loaded bonding material. The bonding material is, for example, epoxy resin loaded with a ferro-electric ceramic filler having a high dielectric constant, such as lead zirconate titanate (PZT). PZT is a solid solution of lead zirconate (PbZrO₃) and lead titanate (PbTiO₃) FR-4 (epoxy-glass cloth) is the type of laminate that has found the widest acceptance as a bonding and insulating medium for printed circuit boards. However, as discussed below, other insulating materials may also be used in the present invention in place of FR-4 laminate, and other high dielectric constant materials may be substituted for PZT to load the epoxy resin. Additional suitable high dielectric constant ferro-electric materials are those having a Curie temperature $T_c$ that is somewhat above the operating temperature of the printed circuit board 100 (e.g., $T_c = 50$ to 100 degrees C.). The class of materials called perovskites (which include PZT) are further examples of alternative ferro-electric materials. In addition to PZT, other perovskites having suitably high dielectric constants include, but are not limited to barium titanate, as well as PZT or barium titanite with calcium, bismuth, iron, lanthanum, or strontium additives. Other alternative ferro-electric materials include materials with a tungsten-bronze crystal structure, including, but not limited to lead meta-niobate ($PbNb_2O_3$), lead metatantalate ($PbTa_2O_3$), sodium barium niobate ($NaBa_2Nb_5O_{15}$), potassium barium niobate ($KBa_2Nb_5O_{15}$), rubidium barium niobate ($RbBa_2Nb_5O_{15}$), as well as the preceding five tantalate/niobate compounds with bismuth, lanthanum, or strontium additives.

Alternatively, certain para-electric materials may also be suitable for loading the epoxy resin. A para-electric material is one which exhibits a high dielectric constant range at temperatures somewhat above its Curie temperature. Suitable para-electric materials would be those materials having Curie temperatures somewhat below the printed circuit board 100 operating temperature (e.g., $T_c = -70$ to 0 degrees C.).

High Dielectric Constant Sol-Gels

A category of suitable epoxy resin loading materials having high dielectric constants include materials made from a class of ferro-electric compositions referred to as "sol-gels." Sol-gels are made from liquid based Alkoxide precursors, such as lead acetate [$Pb(CH_3COO)_2 3-H_2O$], titanium (IV) isopropoxide [$Ti(OC_3H_7)_4$], and zirconium n-propoxide $Zr(OC_3H_7)_4$]. A stock solution is formed by combining the distilled solutions of the two separate precursor solutions. The first precursor solution contains a mixture of lead acetate and titanium isopropoxide in a common solvent of 2-Methoxyethanol. The second precursor solution contains a mixture of lead acetate and zirconium n-propoxide in a common solvent of 2-Methoxyethanol. The concentrations of the precursor chemicals used in the sol-gel process is well-known in the art; however, a concentration of 1.5 g-moles of total metallic elements (Pb+Zr+Ti) per liter of precursor solution is presently preferred. It is to be noted that other Alkoxide/solvent combinations may be used to obtain a sol-gel suitable for use in the present invention. The Alkoxide precursors go through a gel-forming stage after hydrolization at less than 200° C. After the selected Alkoxide/solvent stock solution is mixed with the hydrolizing solution it is heated and dried to form an amorphous phase of the ferro-electric material. The resulting solidified sol-gel is then sintered at a temperature of $\approx 600°$ C. to achieve a high dielectric phase ferro-electric ceramic material having a dielectric constant as high as 10,000 to 20,000. (The sol-gel process is described in "Properties of Very Thin Sol-Gel Ferroelectrics," Sanchez et al., Proceedings of the Second Symposium on Integrated Ferroelectrics, *Ferroelectrics*, Vol. 116, pp. 1–17, Gordon and Breach Science Publishers, 1991.)

Epoxy Loading with the Dielectric Filler

Two methods of loading the high dielectric constant filler material into the FR-4 epoxy are described herein. In the first method, the epoxy is loaded with a high dielectric constant nanopowder. Before being incorporated into the epoxy bonding material, the selected ferro-electric ceramic substance, for example, PZT, is first ground to a nanopowder wherein the average particle radius is preferably less than 0.5 microns. It is to be expressly understood, however, that a larger particle size may be employed and the resulting power distribution core element 150 will still be within the scope of the present invention. Grinding the ferroelectric ceramic substance into a fine powder increases the internal surface area of the substance without increasing the volume fraction, and thus provides for a higher dielectric constant and a corresponding higher capacitance to surface area ratio. The center core element 150 is produced by combining the ferro-electric ceramic nanopowder with the epoxy resin, which composite mixture may be used alone or with a low-density fiberglass cloth material to improve strength and/or flexibility or to moderate the capacitance of the resultant core. The density of the cloth material will have an effect on the overall net core capacitance. The net dielectric constant of the core will be inversely proportional to the density or the cloth fiber.

A second method of loading the epoxy with the dielectric material is to directly load a hydrolyzed ferroelectric sol-gel stock solution into the FR-4 epoxy resin. In this method a ferroelectric stock solution is derived from mixing of the distilled solutions of the two precursor chemicals, as described above. The stock solution is then hydrolyzed (as above) and mixed directly with the FR-4 epoxy. This method is operable if the dielectric constant of the amorphous phase ferroelectric has a sufficiently high dielectric constant and/or the sintering temperature of the ferroelectric material is near the curing temperature of the epoxy used in the board 100 construction.

Power Distribution Core Construction

Figure 5:
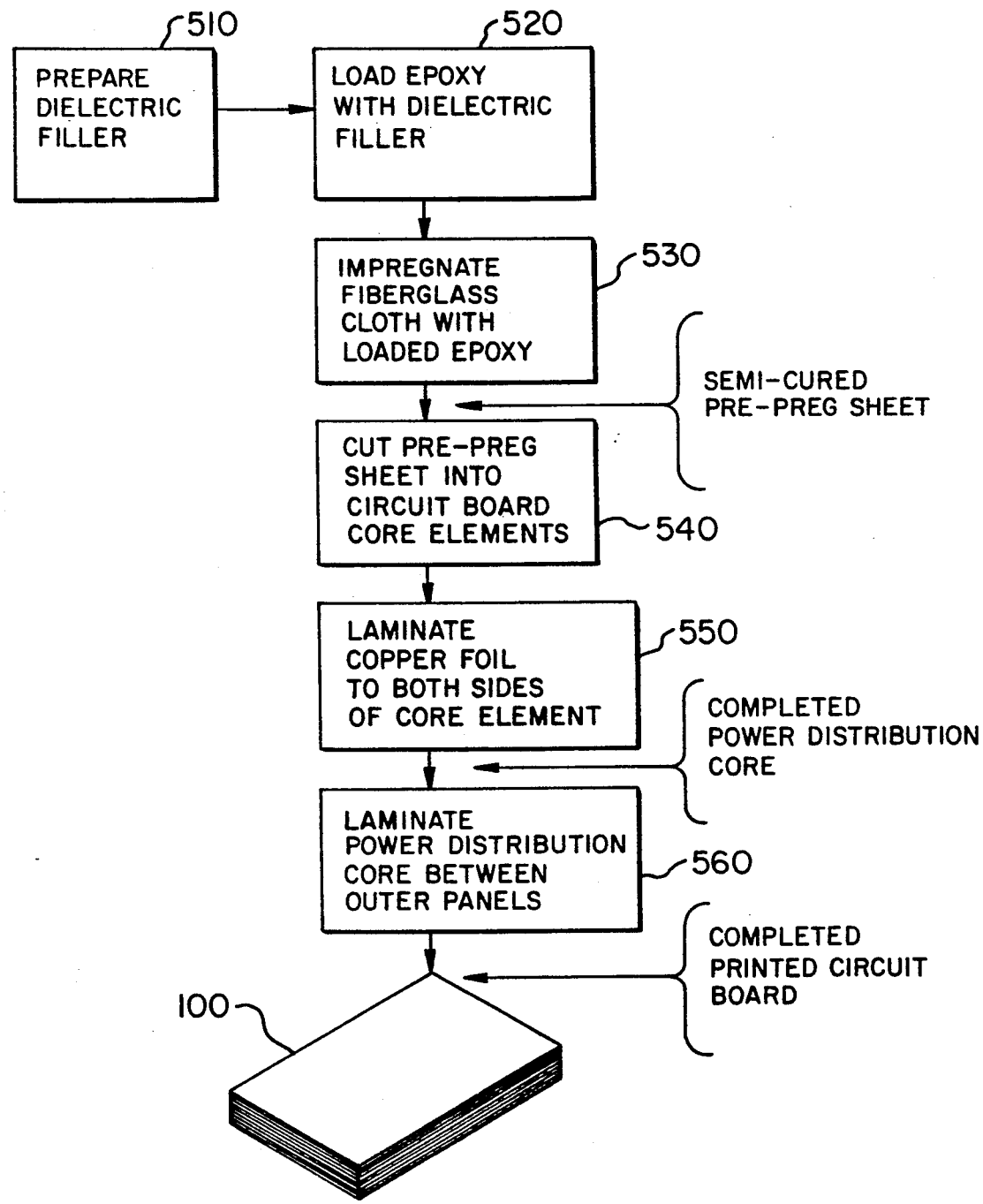
FIG. 5 is a flowchart showing the process steps which are performed in constructing the high capacitance core printed circuit board of the present invention.

FIG. 5 is a flowchart showing the process steps which are performed in constructing the high capacitance core printed circuit board of the present invention. After the dielectric filler material has been prepared, at step 510 (e.g., by grinding the dielectric material to a fine powder), the FR-4 epoxy is then loaded with the dielectric material, at step 520. At step 530, the dielectric/epoxy mixture is used to impregnate a section of fiberglass cloth to produce a semi-cured pre-preg capacitive core sheet. At step 540, the pre-preg core sheet is then cut into circuit board-sized power distribution core elements 150. Next, at step 550, a layer of copper foil 120 is laminated to each side of each core element 150, thus completing the high capacitance power distribution core 140, with one copper foil layer 120 providing a power plane 160 and the other layer providing a ground plane 170.

If it is desired to provide separate power circuit paths on the power plane 160 and/or ground plane 170, then, at this point, the copper foil of the appropriate plane(s) 160/170 is etched accordingly. At step 560, the power distribution core 140 is laminated between two standard FR-4 epoxy filled prepreg panels 110 for the purpose of providing electrical insulation. Finally, a desired number of pre-etched foil-clad 120 fiberglass panels 110 are laminated to one or both sides of the power distribution core 140 to complete the printed circuit board 100 construction. Printed circuit board lamination and etching techniques mentioned above are well-known in the art. It is to be expressly understood that other circuit board construction techniques may be applied to both the power distribution core 140 and the laminations attached thereto, and the resulting circuit board 100 will still fall within the scope of the present invention. Such construction techniques include, but are not limited to, the use of alternative dielectric fillers and insulating materials described throughout this document.

Alternatively, the core element 150 could be constructed solely from dielectric-loaded epoxy or other insulating material loaded with a dielectric material. The step of impregnating the glass cloth is thus eliminated, and the core element 150 is laminated with copper foil 120, as described above. Structural rigidity would be supplied by the fiberglass panels 110 which are laminated to the core element 150.

Effective Dielectric Constant of Composite Materials

When, as in the present invention, two materials having widely differing dielectric properties are combined (i.e., a high dielectric constant filler and a relatively low dielectric constant epoxy bonding material), the resultant effective dielectric constant of the combination varies considerably with the ratio of the two materials. In order to determine the capacitance of the core element 150 of the present invention, the effective dielectric constant of the combination of materials in the core element 150 must first be determined.

Mixed dielectric constant systems are theoretically quite complicated, especially when the permittivities and conductivities of the constituent phases differ considerably. The subject can be simplified, however, by addressing the dielectric constant of a mixture of two isotropic phases, given their dielectric constants. A widely used empirical relationship (due to Lichtenecker) is represented by:

$$logK'_T = v_1 logK'_1 + v_2 logK'_2$$

here $K'_T$ = effective (resultant) dielectric constant, $v_1$ and $v_2$ are volume fractions of the constituents in a two phase mixture, and $K'_1$ and $K'_2$ are the corresponding dielectric constants of each phase in the mixture. In using this relationship, there is no concern for the physical geometry of the system.

Figure 2:
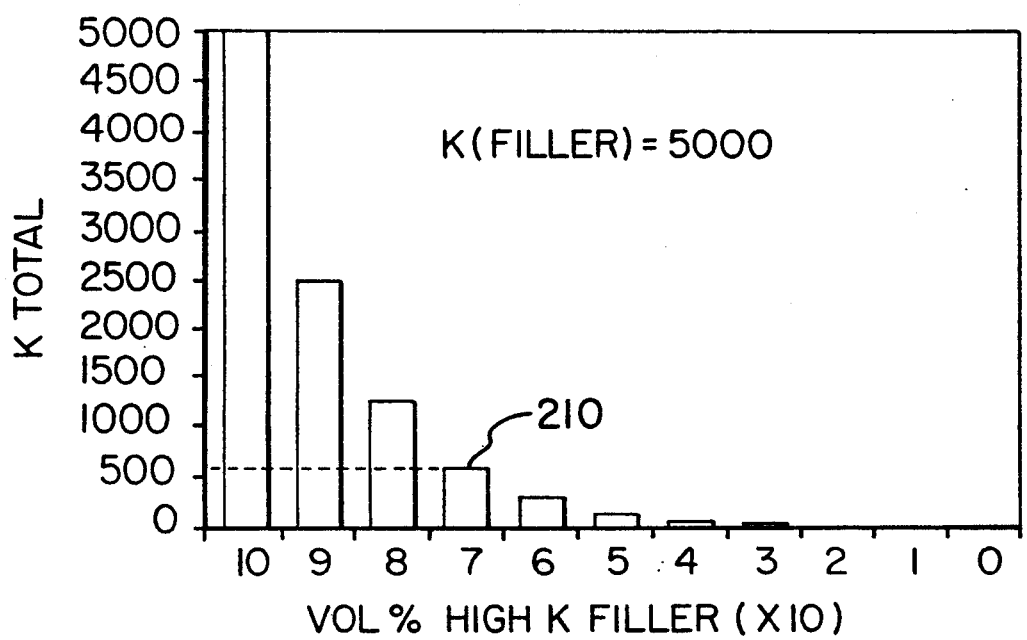
FIGS. 2 and 3 show the results of applying Lichtenecker's mixing rule to various volume ratios of glass cloth-epoxy to high dielectric constant filler.
Figure 3:
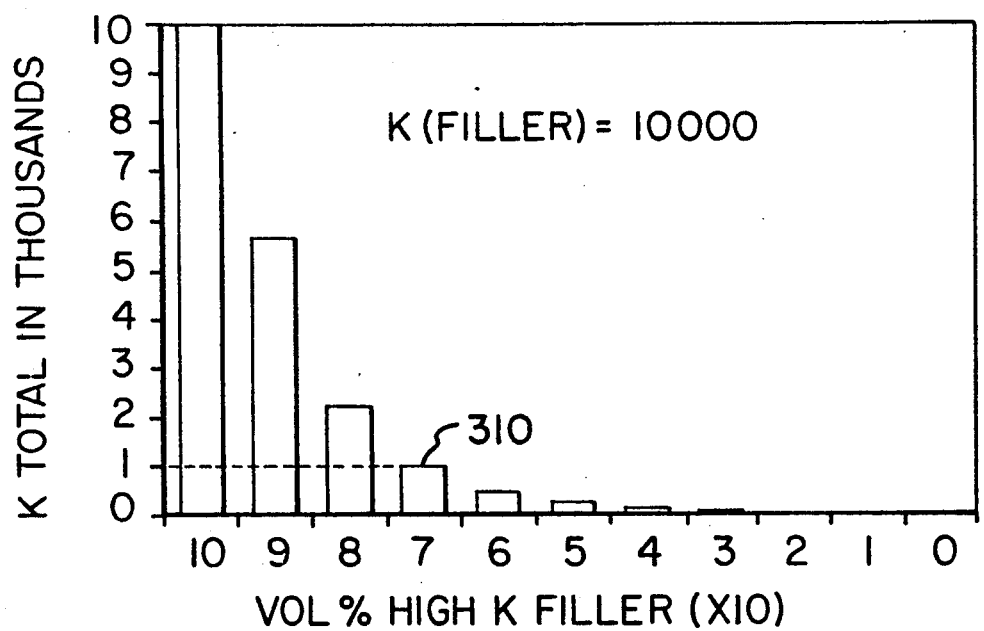

FIGS. 2 and 3 show the results of applying Lichtenecker's mixing rule to various volume ratios of high dielectric constant filler to the composite glass cloth-epoxy/high dielectric constant filler mixture. In each of FIGS. 2 and 3, the vertical axis represents the effective dielectric constant K of the composite mixture, and the horizontal axis represents the total volume percent of high dielectric constant filler. Both FIGS. 2 and 3 assume a glass cloth-epoxy material having a dielectric constant (prior to filling) of 5. FIG. 2 shows the effective dielectric constant of the composite when filled with a material having a dielectric constant of 5000. FIG. 3 shows the effective dielectric constant of the composite when filled with a material having a dielectric constant of 10,000. If it is assumed that proper adherence of the dielectric medium (glass cloth/epoxy/high K filler) to the printed circuit board copper foil cladding can only be achieved at some minimum ratio of glass cloth-epoxy to filler, the filler dielectric required to obtain a given effective (composite) capacitor dielectric constant can be determined. In the following examples, it is assumed that the composite dielectric mixture must contain at least 30% by volume glass cloth-epoxy to achieve adherence (thus implying a 70% maximum filler volume). If a composite dielectric constant of 500 is required, it can be seen from FIG. 2, at 210, that the filler (70% volume) must have a dielectric constant (K) of approximately 5000. Assuming again, that the filler occupies 70% of the total dielectric medium, then, using a filler with a dielectric constant of 10,000, it can be seen from FIG. 3, at 310, that the effective dielectric constant of the composite is approximately 1000.

Using standard printed circuit board assembly techniques incorporating loaded epoxy-impregnated fiberglass cloth as the separator/insulator material, the fiberglass cloth thickness determines the capacitor plate separation distance in the printed circuit board power distribution core 140. Assuming a standard density cloth material and minimal fiberglass cloth thickness of 1 mil (0.001 inch) and a desired capacitance of 0.1 microfarad per square inch, a composite dielectric constant of approximately 500 is required. If, however, physical printed circuit board processing constraints limit the plate separation to, for example, 5 mils (0.005 inch), then a composite dielectric constant of approximately 3000 is required. If a cloth of lower density weave is used for spacing then a proportionately lower epoxy/ferroelectric composite dielectric constant will be required.

By employing a fiberglass-epoxy core element 150 having a 70% by volume PZT nanopowder filler, a composite dielectric constant of greater than 1000 is practicably achievable in accordance with the present invention. Therefore, utilizing a printed circuit board core element 150 having, for example, a dielectric constant of 1000, and a core element thickness of approximately 2 mils (0.002 inch) provides for a 0.1 microfarad per square inch core element capacitance. This capacitance to area ratio provides a total capacitance of 5 microfarads on a printed circuit board 100 with a typical surface area of 50 square inches. Such a total capacitance is sufficient to totally eliminate the need for decoupling capacitors on a typical printed circuit board 100.

Increasing Core Capacitance

Figure 4:
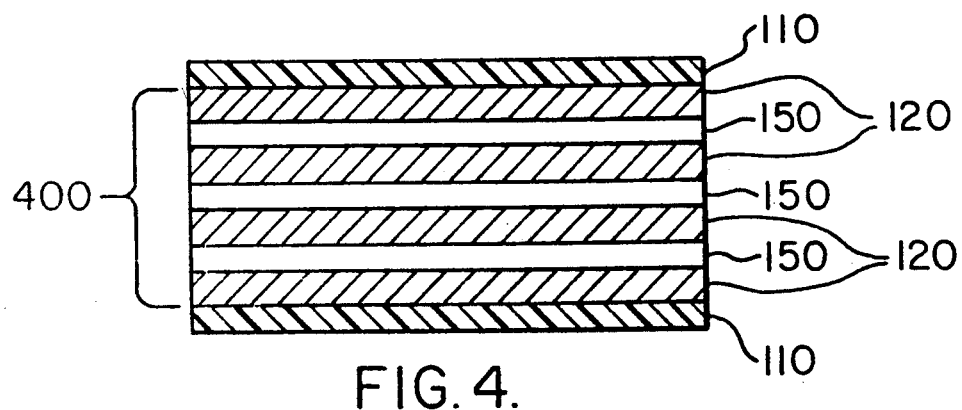
FIG. 4 shows an alternative multiple-layer high capacitance core of the present invention.

If required, higher capacitance can be achieved by using materials with higher dielectric constants, by increasing the dielectric filler-to-glass cloth ratio, by using lower density cloth materials, and/or by employing multiple-layer core elements 150. FIG. 4 shows an alternative multiple-layer high capacitance core 400 in accordance with the present invention. The multiple-layer core 400 is comprised of a plurality of high capacitance core elements 150 (as described above) laminated between copper foil layers 120 thereby providing for increased capacitance relative to a core 140 having a single core element 150. Fiberglass panels 110 are then laminated, as required, to the core 400 as in the foregoing description.

FR-4 Epoxy and Alternative Insulating Materials

The insulating laminate most widely used in the manufacture of printed circuit boards is designated FR-4, which is a fire-retardant, epoxy-impregnated glass cloth composite. The typical epoxy resin used in FR-4 composite is the diglycidyl ether of 4,4'-bis(hydroxyphenyl) methane, or low-molecular weight polymers thereof. This is referred to as a bisphenolA (BPA)-based system. Fire retardancy is imparted by including enough tetrabromobisphenol-A with the BPA to provide 15% to 20% bromine content. The curing agent typically used for the epoxy resin is dicyandiamide (DICY). The catalyst or accelerator is usually a tertiary amine, such as tetramethyl butane diamine, 1,3 bis (dimethyl amino) butane (TMBDA).

A number of insulating polymers could be used as a substitute for the epoxy resin used in FR-4 composite. Examples include, but are not limited to, thermoplastics such as acetals and related copolymers; acrylics; cellulosics; fluoroplastics; ketone-based resins; nylons (polyamides); polyamide-imides; polyarylates; polybutylenes; polycarbonates; polyesters; polystyrenes; polyether sulfones; polyphenylene oxides; polyphenylene sulfides; certain liquid crystal polymers; and mixtures and/or copolymers thereof. Other insulators which could be substituted for the FR-4 epoxy resin are thermosetting resins including, but not limited to, epoxy resins resins including, but not limited to, epoxy resins (other than FR-4); unsaturated polyester resins; vinyl resins; phenol resins; melamine resins; polyurethane resins; polyvinylbutylral resins; polyamide-imide resins; polyimide resins; silicone resins; and mixtures and/or copolymers thereof.

Any one of the insulating materials listed above could be used in accordance with the present invention by being loaded with a ferro-electric ceramic filler having a high dielectric constant, such as lead zirconate-titanite. The loaded polymer could then be used alone as a dielectric medium, or could be used to impregnate glass cloth to create a substitute for FR-4 epoxy-glass cloth composite.

A typical FR-4 composite has a 1 megahertz dielectric constant of 4.0–5.5, and an x,y coefficient of thermal expansion of 160–200. In comparison, a typical polyimide-glass cloth composite, such as polyether imide, has a 1 megahertz dielectric constant of 4.0–5.0, and an x,y coefficient of thermal expansion of approximately 140.

In numerous possible embodiments, a printed circuit board 100 using a power distribution core 140 with a glass fiber/high dielectric constant nanopowder loaded epoxy construction is capable of providing a capacitance of greater than 0.1 microfarads per square inch, which is an improvement of 4 orders of magnitude over the prior art. Implementation of the present invention would not only have a major economic impact in the production of printed circuit boards, but would also result in a quantum leap in electronics system reliability.

It is to be expressly understood that the claimed invention is not to be limited to the description of the preferred embodiment but encompasses other modifications and alterations within the scope and spirit of the inventive concept.

We claim:

1. A printed circuit board comprising:
    a planar top outer layer;
    a planar bottom outer layer; and
    a planar capacitive core element disposed in parallel relation between said top outer layer and said bottom outer layer, said capacitive core element including an electrically conductive ground plane, and a dielectric plane disposed therebetween, said dielectric plane comprising a nanopowder-loaded electrically insulative material including a pre-fired ceramic powder having a high dielectric constant.

2. The printed circuit board of claim 1 wherein said capacitive core element comprises a plurality of dielectric planes, each of said dielectric planes being separated by an electrically conductive element.

3. The printed circuit board of claim 1, wherein at least one of said planar outer layers comprises means for interconnecting a plurality of components mounted thereupon.

4. The printed circuit board of claim 1, wherein said nanopowder loaded material comprises an insulating material loaded with a fine powder, said powder having a dielectric constant more than 10 times greater than a dielectric constant of said electrically insulative material.

5. The printed circuit board of claim 1, wherein said nanopowder loaded material comprises epoxy resin loaded with a fine powder, said powder having a dielectric constant more than 10 times greater than a dielectric constant of said epoxy resin.

6. The printed circuit board of claim 1, wherein said high dielectric constant of said pre-fired ceramic powder is greater than 500.

7. The printed circuit board of claim 1, wherein said dielectric plane medium has a dielectric constant greater than 50.

8. The printed circuit board of claim 1, wherein an average radius of a particle in said pre-fired ceramic powder is less than 1 micron.

9. The printed circuit board of claim 1, wherein said pre-fired ceramic powder comprises a ferro-electric material.

10. The printed circuit board of claim 1, wherein said pre-fired ceramic powder is a ferro-electric material selected from the group of materials having a Perovskite crystal structure comprising barium titanate and lead zirconate-titanate.

11. The printed circuit board of claim 10, wherein any of said materials in said group of materials having a Perovskite crystal structure are combined with an additive selected from the group comprising calcium, bismuth, iron, lanthanum, and strontium.

12. The printed circuit board of claim 1, wherein said pre-fired ceramic powder is a ferro-electric material selected from the group of materials having a tungsten-bronze crystal structure comprising lead meta-niobate, lead meta-tantalate, sodium barium niobate, potassium barium niobate, and rubidium barium niobate.

13. The printed circuit board of claim 12, wherein any of said materials in said group of materials having a tungsten-bronze crystal structure are combined with an additive selected from the group comprising bismuth, lanthanum, and strontium.

14. The printed circuit board of claim 1, wherein said pre-fired ceramic powder is a ferro-electric material having a Curie temperature equal to or greater than an operating temperature of said printed circuit board.

15. The printed circuit board of claim 14, wherein said Curie temperature of said ferro-electric material is between 50 degrees centigrade and 100 degrees centigrade.

16. The printed circuit board of claim 1, wherein said pre-fired ceramic powder is a para-electric material having a Curie temperature less than an operating temperature of said printed circuit board.

17. The printed circuit board of claim 16, wherein said Curie temperature of said para-electric material is between −70 degrees centigrade and 0 degrees centigrade.

18. The printed circuit board of claim 1, wherein said pre-fired ceramic powder is derived from a sol-gel composition, said sol-gel composition having been fired, and ground to said fine powder.

* * * * *